United States Patent
Zhang et al.

(10) Patent No.: US 7,500,513 B2
(45) Date of Patent: Mar. 10, 2009

(54) HEAT-PIPE TYPE HEAT SINK

(75) Inventors: Jing Zhang, Shenzhen (CN); Yeu-Lih Lin, Taipei Hsien (TW); Chin-Lung Chen, Taipei Hsien (TW); Ming-Liang Hao, Shenzhen (CN); Ming Yang, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 16 days.

(21) Appl. No.: 11/556,533

(22) Filed: Nov. 3, 2006

(65) Prior Publication Data

US 2008/0105408 A1     May 8, 2008

(51) Int. Cl.
*B23K 31/02* (2006.01)
*F28D 15/02* (2006.01)

(52) U.S. Cl. .................... 165/76; 165/104.33; 228/183; 228/249

(58) Field of Classification Search .................... 165/76, 165/104.33; 228/249
See application file for complete search history.

(56) References Cited

U.S. PATENT DOCUMENTS

| | | | | |
|---|---|---|---|---|
| 6,382,307 | B1 * | 5/2002 | Wang et al. | 165/80.3 |
| 6,435,266 | B1 | 8/2002 | Wu | |
| 6,550,529 | B1 * | 4/2003 | Horng et al. | 165/80.3 |
| 6,640,888 | B1 * | 11/2003 | Horng et al. | 165/185 |
| 6,749,011 | B2 * | 6/2004 | Horng et al. | 165/80.3 |
| 7,273,094 | B2 * | 9/2007 | Lin | 165/182 |
| 2001/0042615 | A1 | 11/2001 | Moore et al. | |
| 2003/0079862 | A1 | 5/2003 | Moore et al. | |
| 2005/0067149 | A1 * | 3/2005 | Wu | 165/104.11 |
| 2005/0073811 | A1 * | 4/2005 | Wang et al. | 361/688 |
| 2006/0108104 | A1 * | 5/2006 | Li | 165/104.33 |
| 2006/0144580 | A1 * | 7/2006 | Wang | 165/182 |

FOREIGN PATENT DOCUMENTS

| | | |
|---|---|---|
| CN | 2590170 Y | 12/2003 |
| CN | 2718499 Y | 8/2005 |
| CN | 200620002212.4 | 3/2007 |

* cited by examiner

*Primary Examiner*—Allen J Flanigan
(74) *Attorney, Agent, or Firm*—Frank R. Niranjan (57) ABSTRACT

A heat-pipe type heat sink (100) includes a plurality of fins (10), at least a heat pipe (20) extending through the fins, and soldering material (40) disposed between the heat pipe and the fins. Each of the fins defines therein a through hole (12) and a cutout (13) adjacent to the through hole. A sidewall of the through hole forms a collar (122) contacting with the heat pipe, whilst a sidewall of the cutout forms at least a fringe (132) connecting with the collar. The fringe guides the soldering material in molten state to flow from the cutout towards the collar to fill in a gap formed between the heat pipe and the fins to bond the heat pipe and the fins together after the molten soldering material is cooled.

19 Claims, 8 Drawing Sheets

HEAT-PIPE TYPE HEAT SINK

BACKGROUND OF THE INVENTION

1. Field of the Invention

The present invention relates generally to a heat sink, and more particularly to a heat-pipe type heat sink for dissipating heat generated by electronic components.

2. Description of related art

A conventional heat-pipe type heat sink includes a plurality of fins and a heat pipe extending through the fins. Each of the fins defines a larger hole, and a smaller hole above the larger hole. The smaller hole partially connects with the larger hole at a bottom end thereof.

In assembly of the heat sink, the heat pipe extends through the larger holes of the fins, while a solder stick extends through the smaller holes of the fins. The solder stick is heated to melting point so that the molten solder flows into the larger holes and fills gaps formed between the heat pipe and the fins. The molten solder is cooled so as to firmly bond the heat pipe to the fins to complete the assembly of the heat sink.

When the molten solder flows towards the larger holes, a part of the molten solder can not be timely guided towards the gaps and therefore bleeds towards spaces formed between two adjacent fins. When that part of the molten solder is cooled, a plurality of solder beads are formed between the fins. Therefore, the solder cannot fully fill the gaps, which results in an incomplete connection between the heat pipe and the fins, and further decreases the thermal connection between the heat pipe and the fins. Furthermore, the solder bleeds adversely affect the aesthetic appearance of the heat sink and cause a waste of the solder. Thus, an improvement is required to overcome the defects of the prior art.

SUMMARY OF THE INVENTION

The present invention relates to a heat-pipe type heat sink for dissipating heat generated by electronic components. According to a first embodiment of the present invention, the heat-pipe type heat sink includes a plurality of fins, at least a heat pipe extending through the fins, and soldering material disposed between the heat pipe and the fins. Each of the fins defines therein a through hole and a cutout adjacent to the through hole. A sidewall of the through hole forms a collar contacting with the heat pipe, whilst a sidewall of the cutout forms at least a fringe connecting with the collar. The fringe guides the soldering material in molten state to flow from the cutout towards the collar to fill in a gap formed between the heat pipe and the fins to bond the heat pipe and the fins together after the molten soldering material is cooled.

Other advantages and novel features of the present invention will become more apparent from the following detailed description of preferred embodiment when taken in conjunction with the accompanying drawings, in which:

BRIEF DESCRIPTION OF THE DRAWINGS

Many aspects of the present invention can be better understood with reference to the following drawings. The components in the drawings are not necessarily drawn to scale, the emphasis instead being placed upon clearly illustrating the principles of the present invention. Moreover, in the drawings, like reference numerals designate corresponding parts throughout the several views.

DETAILED DESCRIPTION OF THE INVENTION

Referring to FIGS. 1 through 4, a heat-pipe type heat sink 100 according to a first embodiment of the present invention is shown. The heat-pipe type heat sink 100 includes a plurality of fins 10 and three U-shaped heat pipes 20 with condenser sections 21 thereof extending through the fins 10.

Each of the fins 10 includes a rectangular-shaped main body 11, and four flanges 14 extending backwardly from corners thereof. The fins 10 are stacked together with the flanges 14 of a front fin 10 abutting against the main body 11 of a rear fin 10. A plurality of air passages 17 are formed between two adjacent fins 10, allowing the airflow to pass therethrough. A rectangular-shaped opening 16 is defined in a middle portion of the main body 11, communicating the air passages 17 with each other to thereby increase air turbulence in the air passages 17 and further increase heat dissipating efficiency of the heat sink 100.

Figure 1:
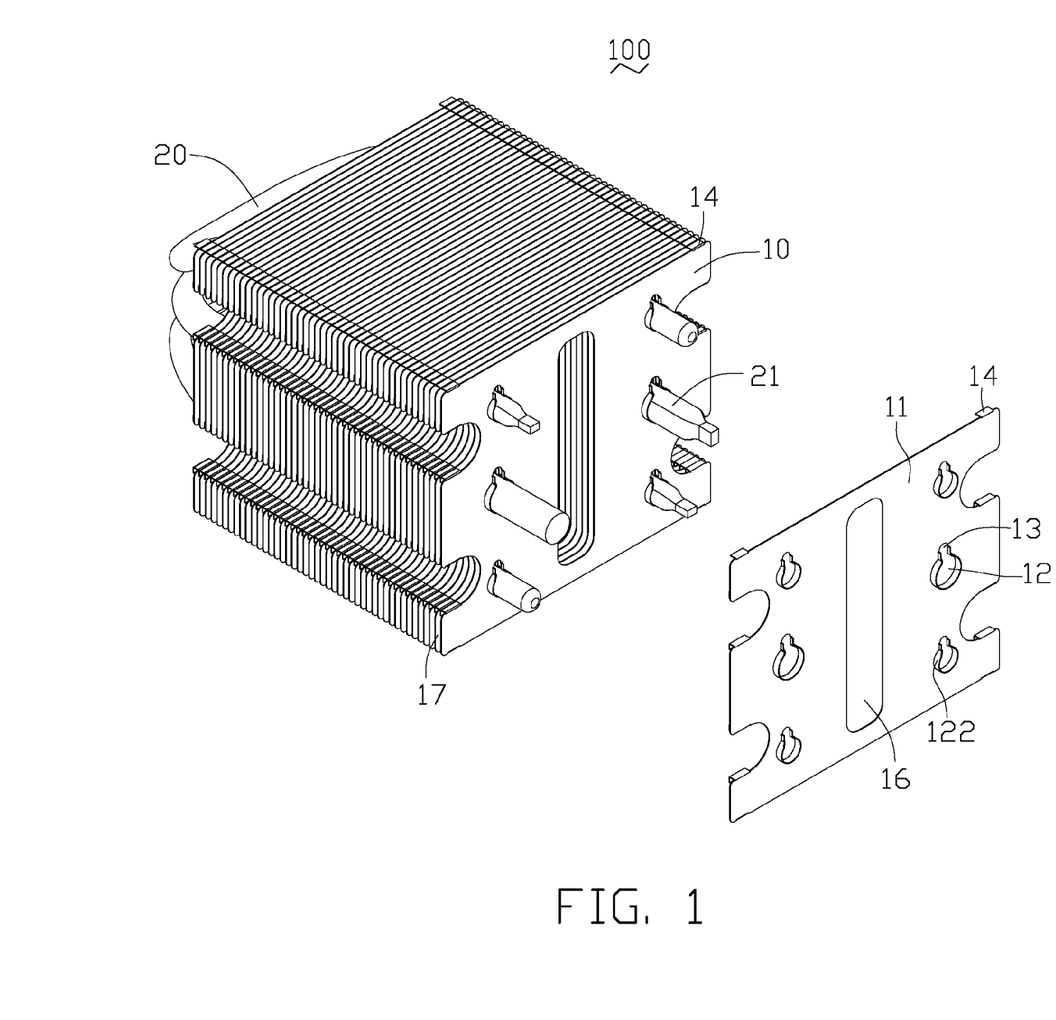
FIG. 1 is an exploded, isometric view of a heat-pipe type heat sink according to a first embodiment of the present invention.
Figure 2:
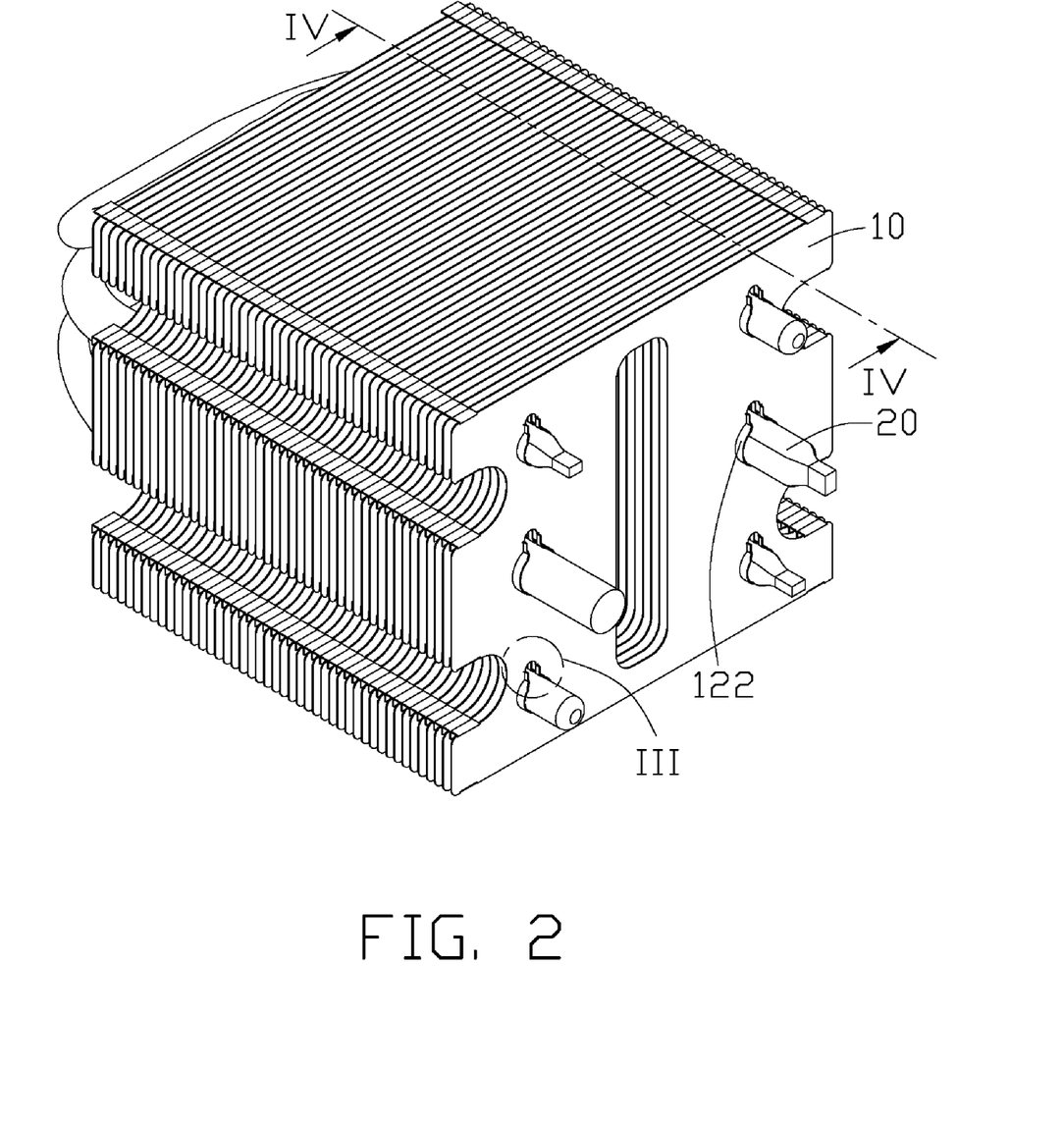
FIG. 2 is an assembled view of the heat-pipe type heat sink of FIG. 1.
Figure 3:
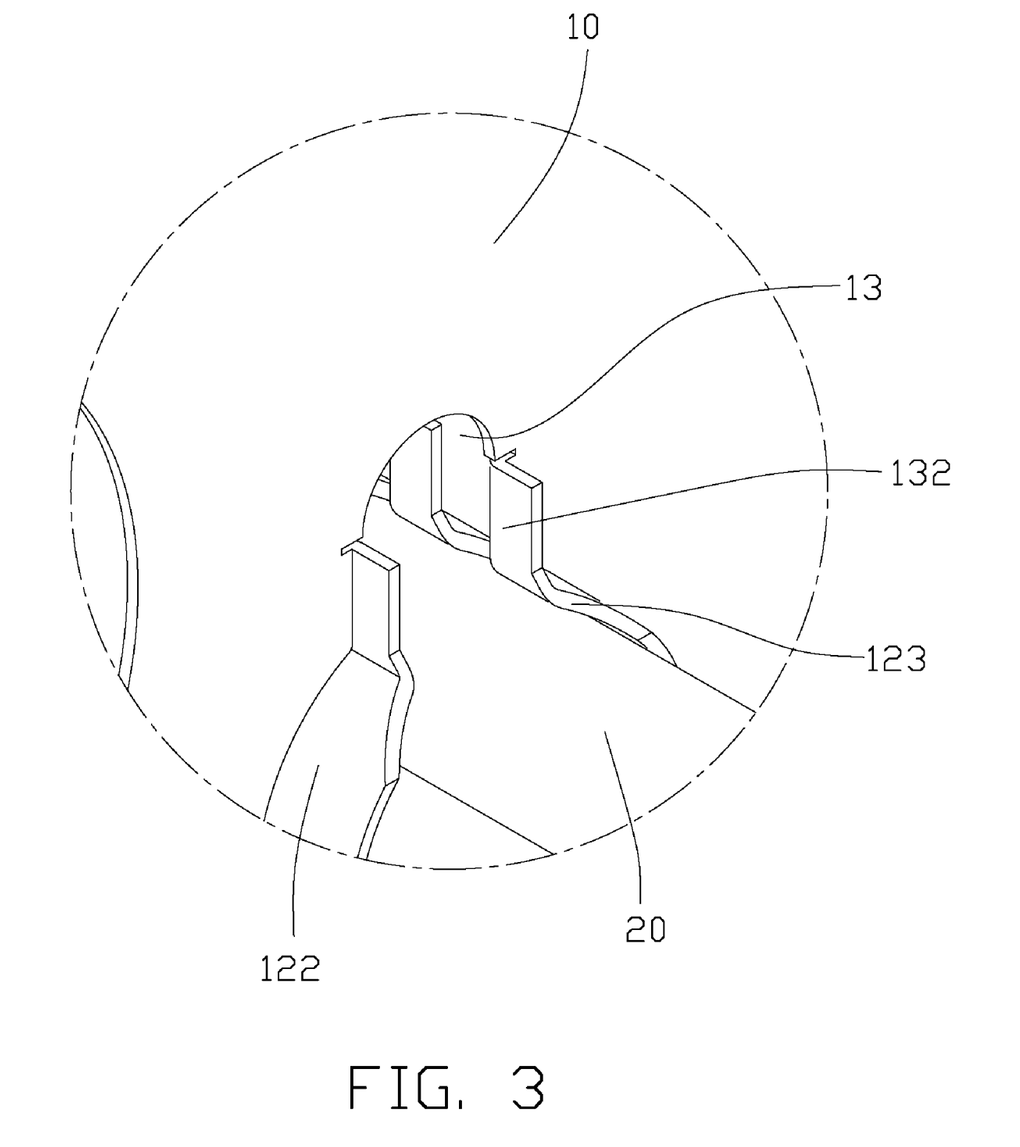
FIG. 3 is a partly enlarged view of a circled portion III of FIG. 2.
Figure 4:
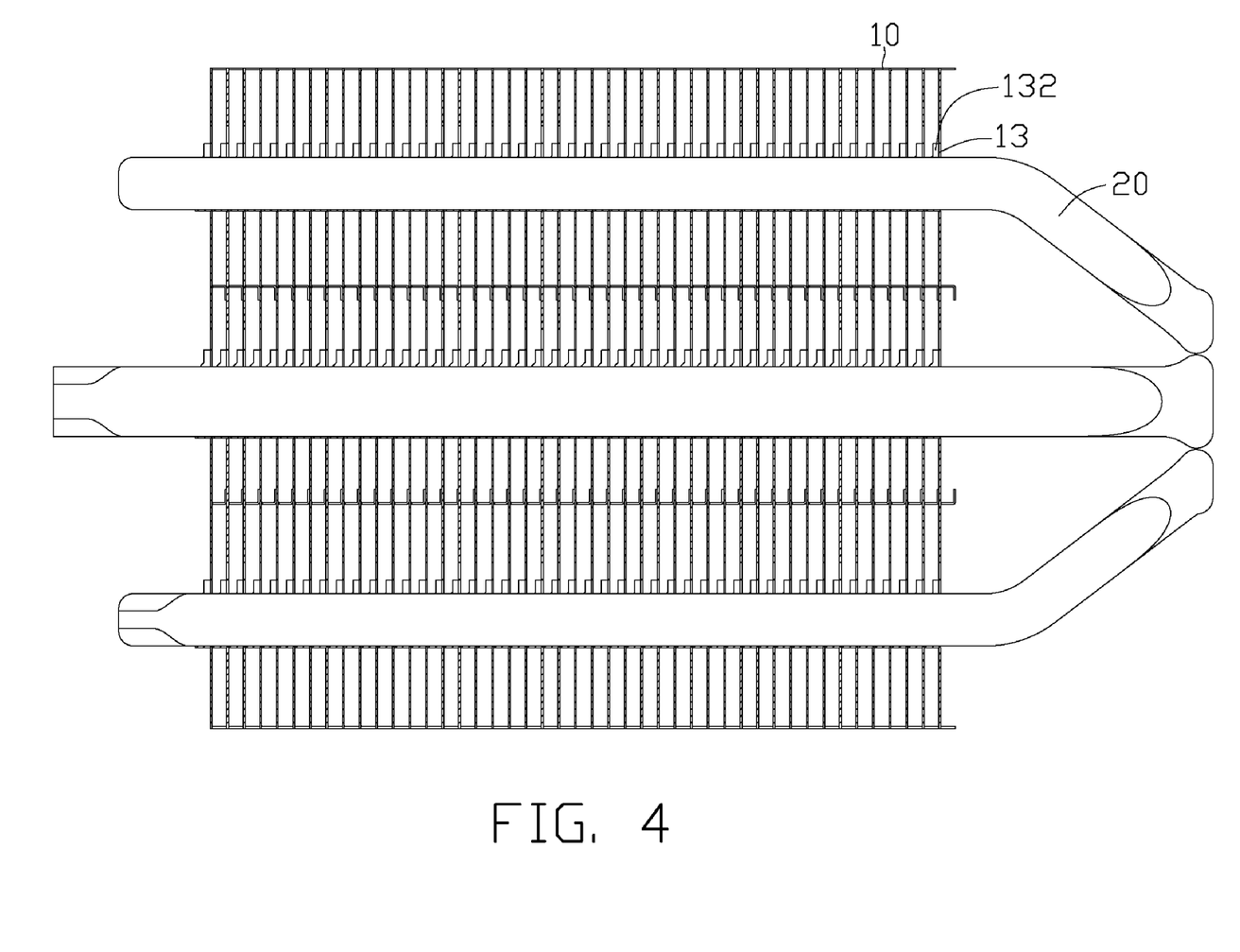
FIG. 4 is a cross sectional view of the heat-pipe type heat sink of FIG. 2, taken along line IV-IV thereof.

The main body 11 of each fin 10 defines therein six rounded through holes 12 and six arc-shaped cutouts 13 above the respective through holes 12. The cutouts 13 communicate with the respective through holes 12 at bottom portions thereof. The through holes 12 allow the condenser sections 21 of the heat pipes 20 extending therethrough, whilst the cutouts 13 allow soldering material 40 such as solder pastes, or solder bars to extend therethrough. Six collars 122 extend forwardly from peripheries of the through holes 12, for contacting with the condenser sections 21 of the heat pipes 20 so as to increase contacting areas between the heat pipes 20 and the fins 10. Two parallel side fringes 132 integrally extend upwardly from top ends of the collar 122 and surround two opposite sides of the cutout 13. Two arc-shaped guiding surfaces 123 (shown in FIG. 3) are formed between and smoothly connect the side fringes 132 with the collar 122.

Figure 5:
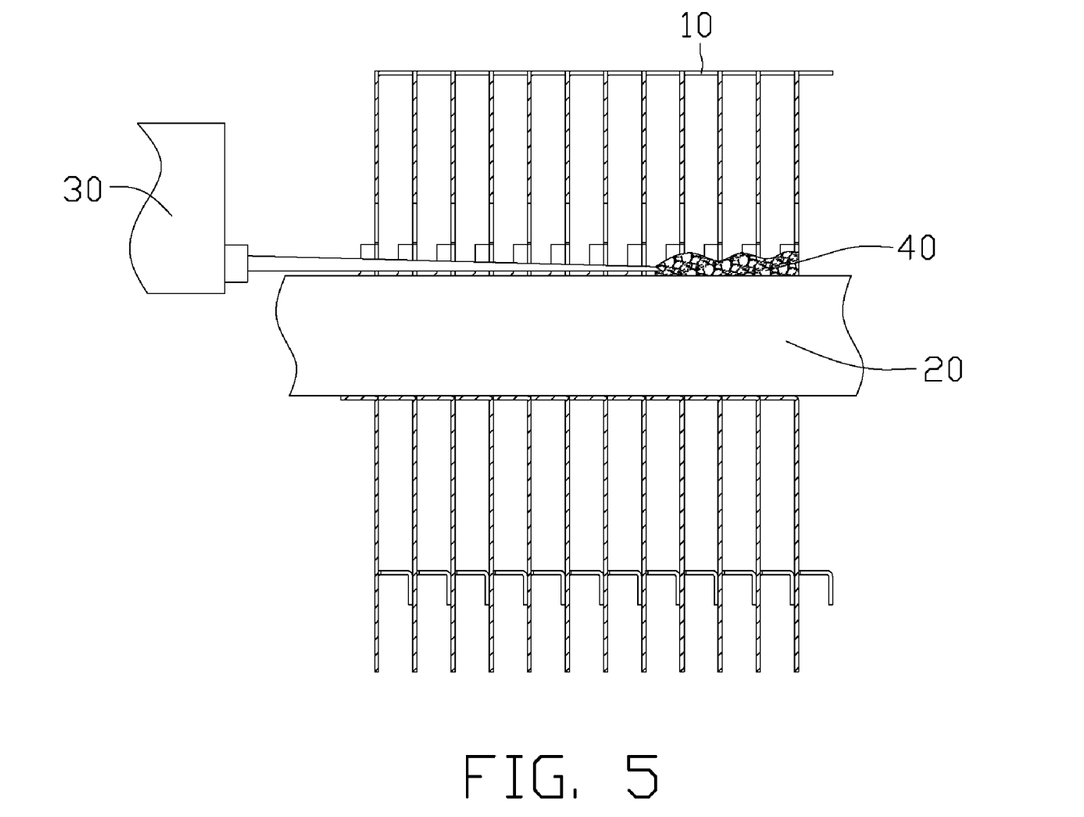
FIG. 5 is a cross sectional view of the heat-pipe type heat sink of FIG. 2, when a soldering material is present between cutouts of fins.
Figure 6:
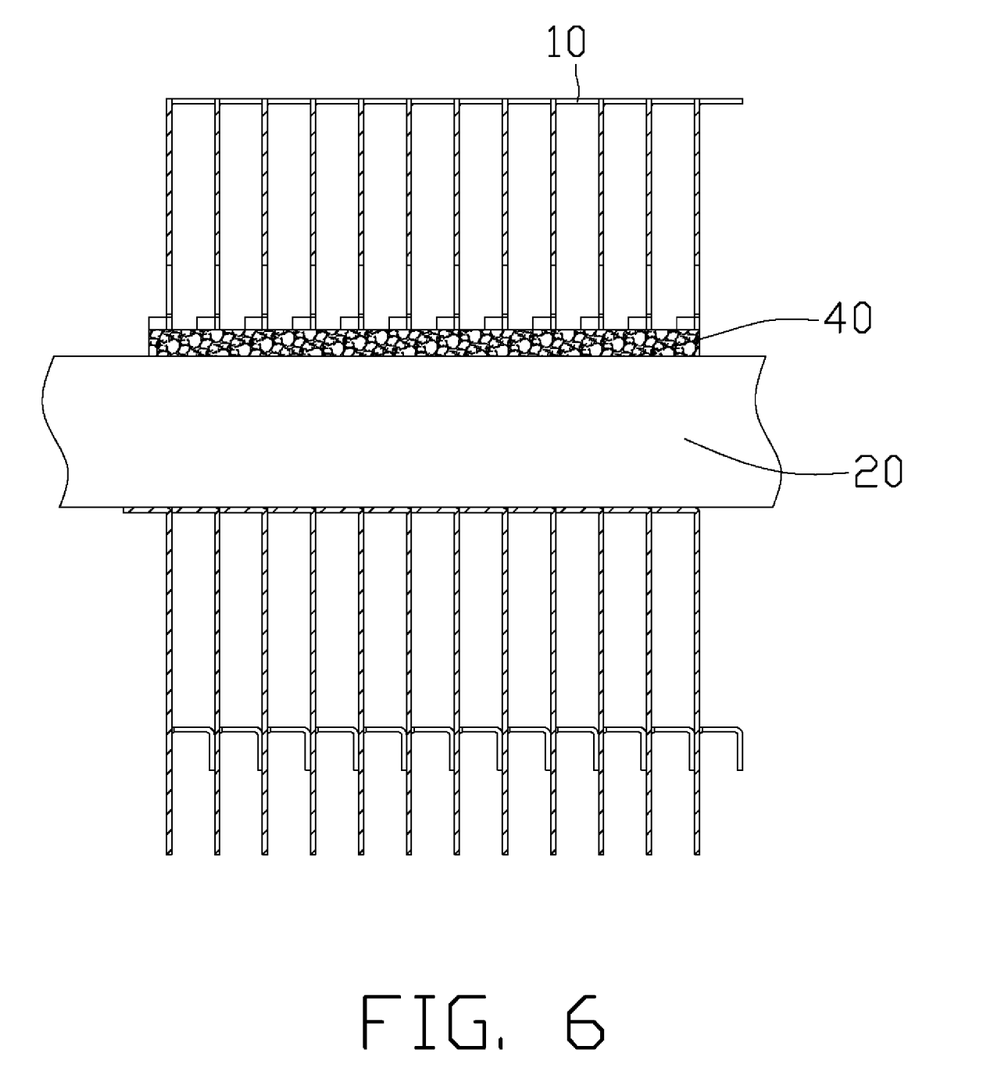
FIG. 6 is a cross sectional view of the heat-pipe type heat sink of FIG. 2, when the cutouts of the fins are filled with soldering material.

Referring to FIGS. 5 and 6, in assembly of the heat-pipe type heat sink 100, the fins 10 are stacked together. The condenser sections 21 of the heat pipes 20 are respectively received in the through holes 12 of the fins 10. Six injectors 30 extend through the cutouts 13 of the fins 10 and spread the soldering material 40 in the cutouts 13 and between the side fringes 132. The heat-pipe type heat sink 100 is thus preassembled. The preassembled heat-pipe type heat sink 100 is heated to a melting point of the soldering material 40, so that the molten soldering material 40 is guided by the side fringes 132, the guiding surfaces 123 and the collars 122 towards gaps formed between the collars 122 and the condenser sections 21 of the heat pipes 20. The molten soldering material 40 is cooled so as to firmly bond the condenser sections 21 of the heat pipes 20 to the collars 122 of the fins 10. The assembly of the heat sink 100 is thus completed.

In the present invention, the side fringes 132 and collars 122 are formed as barriers of the soldering material 40 which prevent the molten soldering material 40 from bleeding from peripheries of the condenser sections 21 of the heat pipes 20, thus decreasing waste of the soldering material 40 and guiding the soldering material 40 fully and smoothly around the condenser sections 21 of the heat pipes 20. In addition, a part of the soldering material 40 can spread on the collars 122 of the fins 10 and bond the condenser sections 21 of the heat pipes 20 thereat to the fins 10, which increases contacting areas between the condenser sections 21 of the heat pipes 20 and the fins 10, and further improves heat dissipation efficiency of the heat-pipe type heat sink 100.

Figure 7:
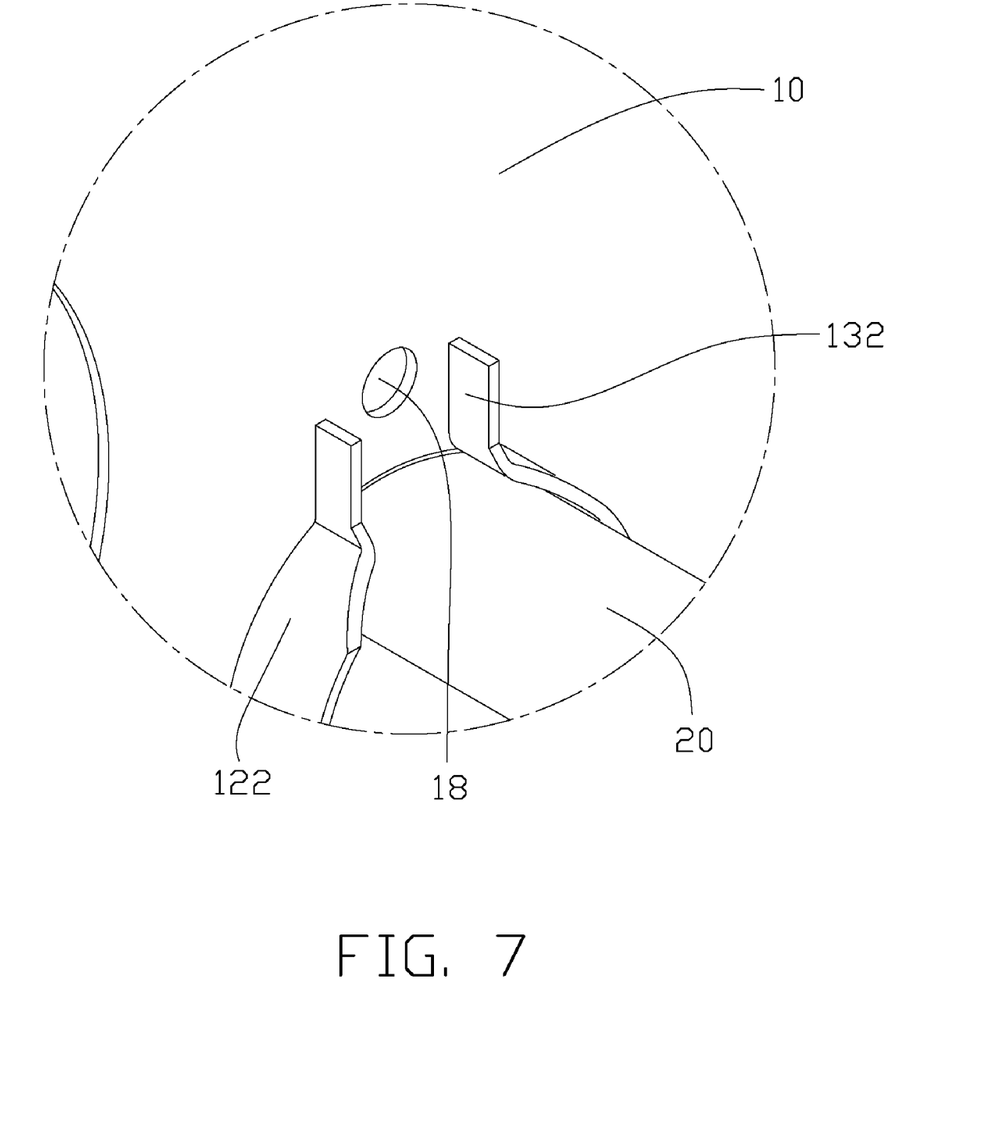
FIG. 7 is similar to FIG. 3, but showing a circled portion of a heat-pipe type heat sink according to a second embodiment of the present invention.

FIG. 7 shows a heat-pipe type heat sink 100 according to a second embodiment of the present invention. The difference between this embodiment and the first embodiment is: a round hole 18 instead of the cutout 13 is defined between the side fringes 132 and isolated from the corresponding through hole 12 of the fin 10. In the assembly of the heat sink 100, the injectors 30 extend through the round holes 18 and fill spaces formed between the main bodies 11 of the fins 10, the side fringes 132, and top surfaces of the condenser sections 21 of the heat pipes 20 with the soldering material 40. When the soldering material 40 is heated to the melting point thereof, the molten soldering material 40 is guided by the side fringes 132, the guiding surfaces 123 and the collars 122 towards and fills the gaps formed between the collars 122 and the condenser sections 21 of the heat pipes 20.

Figure 8:
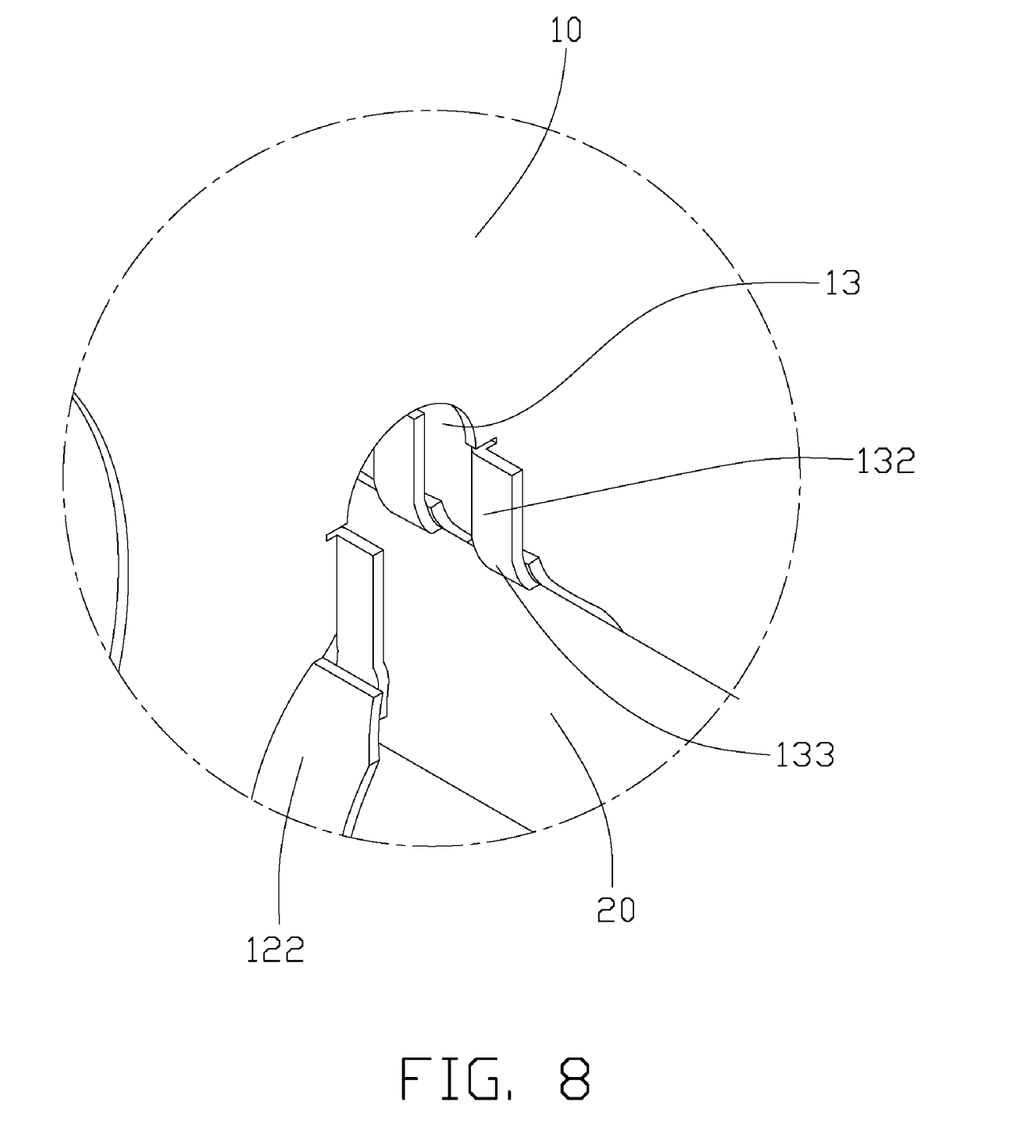
FIG. 8 is similar to FIG. 3, but showing a circled portion of a heat-pipe type heat sink according to a third embodiment of the present invention.

Referring to FIG. 8, a heat-pipe type heat sink 100 according to a third embodiment of the present invention is shown. In this embodiment, the side fringes 132 are individually formed above the collar 122, with bottom ends 133 thereof being spliced under an inner surface of the collar 122. In the assembly of the heat sink 100, the molten soldering material 40 is guided by the side fringes 132 towards the bottom ends 133 thereof and then towards the collars 122 of the through holes 12 so as to smoothly fill in the gaps formed between the collars 122 and the condenser sections 21 of the heat pipes 20. In this embodiment, the side fringes 132 extend forwards from main body 11 of the fin 10. Alternatively, the side fringes 132 may extend backwards from main body 11 of the fin 10, with the bottom ends 133 of the side fringes 132 of the front fin 10 being spliced under inner surfaces of the collars 122 of the rear fin 10.

In the preferred embodiments of the present invention, the side fringes 132 are isolated from each other. Alternatively, the side fringes 132 may be integrally formed with each other via an arc-shaped connecting portion (not shown) extending from a periphery of an arc-shaped top portion of the cutout 13. The side fringes 132 are disposed above the collar 122 in these embodiments. Alternatively, the side fringes 132 may be disposed below the collar 122, or on the right or the left side of the collar 122. During heating the heat-pipe type heat sink 100 needs to be rotated to a position where the molten soldering material 40 can be guided by gravity and the side fringes 132 towards the collars 122. In this way the soldering material 40 can be evenly distributed around the condenser sections 21 of the heat pipes 20. The cross section of the condenser section 21 of the heat pipe 20 is round-shaped in this embodiment. Alternatively, the cross section of the condenser section 21 of the heat pipe 20 may have other appropriate configuration, whilst the collar 122 may have a corresponding configuration mated with the condenser section 21 of the heat pipe 20.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat-pipe type heat sink comprising:
    a plurality of fins each defining therein a through hole and a cutout adjacent to the through hole;
    at least a heat pipe extending through the through holes of the fins; and
    soldering material configured for disposal between the heat pipe and the fins;
    wherein a sidewall of the through hole forms a collar contacting with the heat pipe, and at least a fringe is formed beside the cutout and connects with the collar for guiding the soldering material in molten state to flow from the cutout towards the collar to fill in a gap formed between the heat pipe and the fins to bond the heat pipe and the fins together after the molten soldering material is cooled;
    wherein both of the at least a fringe and the collar extend beyond a plane of the fin along a direction substantially perpendicular to the plane of the fin;
    wherein at least an arc-shaped guiding surface is formed between and smoothly connects the at least a fringe with the collar, and the at least an arc-shaped guiding surface is disposed substantially perpendicular to the plane of the fin.

2. The heat-pipe type heat sink as described in claim 1, wherein the at least a fringe comprises two fringes sandwiching the cutout therebetween, and the two fringes are parallel to each other.

3. The heat-pipe type heat sink as described in claim 1, wherein the cutout is a hole isolated from the through hole of the fin.

4. The heat-pipe type heat sink as described in claim 1, wherein the through hole communicates with the cutout at a predetermined portion thereof.

5. The heat-pipe type heat sink as described in claim 4, wherein the through hole is round-shaped in profile, whilst the cutout is arch-shaped in profile.

6. The heat-pipe type heat sink as described in claim 2, wherein the fringes integrally extend from predetermined portions of the collar.

7. The heat-pipe type heat sink as described in claim 2, wherein the fringes are individually formed and connect with the collar at predetermined portions thereof, with lower ends of the fringes being spliced under an inner surface of the collar.

8. The heat-pipe type heat sink as described in claim 1, wherein the fin defines an elongated opening in a central portion thereof for communicating air passages formed between two adjacent fins with each other.

9. A heat-pipe type heat sink comprising:
    a plurality of fins stacked together wherein a plurality of aligned holes and a plurality of aligned cutouts are defined through the fins; and
    a heat pipe received in the holes of the fins;
    wherein a collar extends forwardly from a sidewall of each of the holes around the heat pipe, a pair of fringes extending upwardly from two upper ends of the collar toward a corresponding cutout, respectively, and solder fills in a gap between the heat pipe and the collar, and wherein the fringes are used for guiding the solder in molten condition to flow from the corresponding cutout into the gap;

wherein the fringes are flange extensions of the collar and located above a main body of the fin.

10. The heat-pipe type heat sink as described in claim 9, wherein an arc-shaped guiding surface is formed between one of the fringes and a corresponding upper end of the collar and perpendicular to the main body of the fin for guiding the solder in molten condition.

11. The heat-pipe type heat sink as described in claim 2, wherein the cutout has an arch portion above the two fringes.

12. The heat-pipe type heat sink as described in claim 9, wherein both of the collar and the fringes perpendicularly protrude from the main body of the fin.

13. The heat-pipe type heat sink as described in claim 9, wherein the cutouts are isolated from the holes.

14. The heat-pipe type heat sink as described in claim 9, wherein the fringes and the collar cooperatively form a flange having an open end.

15. A heat-pipe type heat sink comprising:
a plurality of fins stacked together wherein a plurality of aligned holes and a plurality of aligned cutouts are defined through the fins; and
a heat pipe received in the holes of the fins;

wherein each of the fins comprises a collar protruding out from a main body of the each of the fins and surrounding a corresponding hole, a pair of parallel fringes protruding out from the main body of the each of the fins and located beside a corresponding cutout, solder filled in a gap between the heat pipe and the collar, and wherein two arc-shaped guiding surfaces are formed between and smoothly connect the fringes with the collar for guiding the solder in molten condition to flow from the corresponding cutout into the gap; and wherein the fringes, the guiding surfaces and the collar cooperatively form a flange having an open end.

16. The heat-pipe type heat sink as described in claim 15, wherein both of the collar and the fringes are substantially perpendicular to the main body of the each of the fins.

17. The heat-pipe type heat sink as described in claim 15, wherein the fringes are individually formed and connect with the collar at predetermined portions thereof, with lower ends of the fringes being spliced under an inner surface of the collar.

18. The heat-pipe type heat sink as described in claim 15, wherein the fringes are flange extensions of the collar.

19. The heat-pipe type heat sink as described in claim 15, wherein the corresponding cutout has an arch portion above the fringes.

* * * * *